(12) United States Patent
Yu (10) Patent No.: US 11,665,847 B2
(45) Date of Patent: May 30, 2023

(54) ELECTRONIC DEVICE

(71) Applicant: Wistron Corp., New Taipei (TW)

(72) Inventor: Zhi-Tao Yu, New Taipei (TW)

(73) Assignee: WISTRON CORP., New Taipei (TW)

( * ) Notice: Subject to any disclaimer, the term of this patent is extended or adjusted under 35 U.S.C. 154(b) by 50 days.

(21) Appl. No.: 17/026,053

(22) Filed: Sep. 18, 2020

(65) Prior Publication Data

US 2022/0015256 A1    Jan. 13, 2022

(30) Foreign Application Priority Data

Jul. 8, 2020   (CN) .......................... 202010652128.1

(51) Int. Cl.
*H05K 7/14* (2006.01)
*H05K 5/02* (2006.01)

(52) U.S. Cl.
CPC ......... *H05K 7/1487* (2013.01); *H05K 5/0221* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 8,152,216 B2* | 4/2012 | Howell | B60J 7/085 296/100.18 |
| 2005/0257232 A1* | 11/2005 | Hidaka | G11B 33/126 |
| 2006/0051159 A1* | 3/2006 | Tsai | F16B 7/105 403/109.3 |

FOREIGN PATENT DOCUMENTS

| | | |
|---|---|---|
| CN | 107145200 A | 9/2017 |
| TW | I583294 B | 5/2017 |
| TW | I607301 B | 12/2017 |

* cited by examiner

Primary Examiner — Jerry Wu (57) ABSTRACT

An electronic device is provided. The electronic device includes a housing, a tray, and an orientation restriction mechanism. The tray is rotatably connected to the housing. One end of the orientation restriction mechanism is adjustably connected to the housing, and the other end of the orientation restriction mechanism is adjustably connected to the tray. When the tray is in the first tray orientation, the orientation restriction mechanism has a first mechanism length, and when the tray is in the second tray orientation, the orientation restriction mechanism has a second mechanism length.

15 Claims, 9 Drawing Sheets

ELECTRONIC DEVICE

CROSS REFERENCE TO RELATED APPLICATIONS

This application claims priority of China Patent Application No. 202010652128.1, filed on Jul. 8, 2020, the entirety of which is incorporated by reference herein.

BACKGROUND OF THE INVENTION

Field of the Invention

Embodiments of the present invention relates to an electronic device, and in particular to an electronic device with a tray.

Description of the Related Art

A server is a data storage device with a plurality of hard disks disposed therein. In most conventional servers, the hard disks are adjacent to the front or rear of the server. When a disk needs to be maintained or replaced, the hard disk is detached from the front or the rear of the server.

However, in part of the conventional server, the hard disks are disposed in the middle portion of the server. When the user desires to detach one of the hard disks, the whole hard disk module (including the tray and all the hard disks) must be pulled out, and only then can the specific hard disk be detached from the hard disk module. This conventional server design is not convenient for the user.

BRIEF SUMMARY OF THE INVENTION

Embodiments of the invention are provided to address the aforementioned difficulty.

In one embodiment, an electronic device is provided. The electronic device includes a housing, a tray and an orientation restriction mechanism. The tray is rotatably connected to the housing. One end of the orientation restriction mechanism is adjustably connected to the housing, and the other end of the orientation restriction mechanism is adjustably connected to the tray.

In one embodiment, the tray is adapted to be rotated between a first tray orientation and a second tray orientation relative to the housing, and when the tray is in the first tray orientation, the orientation restriction mechanism has a first mechanism length, and when the tray is in the second tray orientation, the orientation restriction mechanism has a second mechanism length.

In one embodiment, the orientation restriction mechanism includes a first rod and a second rod, the second rod is connected to the first rod, the second rod is adapted to slide relative to the first rod, and when the second rod is in a first rod position relative to the first rod, the orientation restriction mechanism has the first mechanism length, and when the second rod is in a second rod position relative to the first rod, the orientation restriction mechanism has the second mechanism length.

In one embodiment, the orientation restriction mechanism further includes a locking unit, the locking unit is adapted to restrict the position of the second rod relative to the first rod to lock the length of the orientation restriction mechanism, and the locking unit is connected to the first rod and the second rod.

In one embodiment, the first rod includes a rod slot, and the second rod is adapted to slide in the rod slot.

In one embodiment, the locking unit includes a fixing base, a shaft, a fitting member and a lever, the fixing base is affixed to the second rod, the fitting member abuts the first rod, the lever pivots on the fixing base via the shaft, the lever is adapted to be rotated between a first lever orientation and a second lever orientation, and when the lever is in the first lever orientation, the second rod is adapted to slide relative to the first rod, and when the lever is in the second lever orientation, the position of the second rod relative to the first rod is fixed.

In one embodiment, the first rod includes a first rod inner surface and a first rod outer surface, the first rod inner surface faces the second rod, the first rod outer surface is opposite the first rod inner surface, the fitting member abuts the first rod outer surface, the second rod includes a second rod inner surface and a second rod outer surface, the second rod inner surface faces the first rod, and the fixing base is affixed to the second rod outer surface.

In one embodiment, the fitting member includes a first fitting surface and a second fitting surface, the first fitting surface is opposite to the second fitting surface, the first fitting surface contacts the first rod outer surface, the lever is adapted to contact the second fitting surface, and when the lever is in the second lever orientation, the lever presses the second fitting surface, and the fitting member pushes the first rod and the second rod toward the fixing base to fix the position of the second rod relative to the first rod.

In one embodiment, the fitting member includes a curved slot, the curved slot is formed on the second fitting surface, the lever includes a cam portion, the cam portion is adapted to roll along the curved slot, and when the lever is in the second lever orientation, the cam portion presses the curved slot, and the fitting member pushes the first rod and the second rod toward the fixing base to fix the position of the second rod relative to the first rod.

In one embodiment, the first rod includes a first stopper, the first stopper is formed on the first rod inner surface, and when the second rod is in the first rod position relative to the first rod, the second rod abuts the first stopper.

In one embodiment, the first rod includes a second stopper, the second stopper is formed on the first rod outer surface, and when the second rod is in the second rod position relative to the first rod, the fitting member abuts the second stopper.

In one embodiment, the first rod pivots on the housing, and the second rod pivots on the tray.

In one embodiment, the housing includes a first housing post and a second housing post, the tray includes a first tray notch and a second tray notch, the first tray notch is connected to the first housing post, and the second tray notch is connected to the second housing post.

In one embodiment, the first tray notch is V-shaped, and the second tray notch is L-shaped.

In one embodiment, the tray is rotated between the first tray orientation and the second tray orientation around the second housing post, the tray includes a tray handle, the tray handle is located on the front side of the tray, and the first tray notches and the second tray notches are located on the right and left sides of the tray.

In one embodiment, the electronic device further includes a plurality of hard disks, and the hard disks are disposed on the tray.

Utilizing the electronic device of the embodiment of the invention, when the user desires to detach the hard disk, the user can rotate the tray into the second tray orientation, and locks the tray in the second tray orientation using the orientation restriction mechanism. Therefore, the user can load the hard disk easily and conveniently.

A detailed description is given in the following embodiments with reference to the accompanying drawings.

BRIEF DESCRIPTION OF THE DRAWINGS

Embodiments of the present invention can be more fully understood by reading the subsequent detailed description and examples with references made to the accompanying drawings, wherein.

DETAILED DESCRIPTION OF THE INVENTION

This description is made for the purpose of illustrating the general principles of embodiments of the invention and should not be taken in a limiting sense. The scope of the invention is best determined by reference to the appended claims.

Figure 1A:
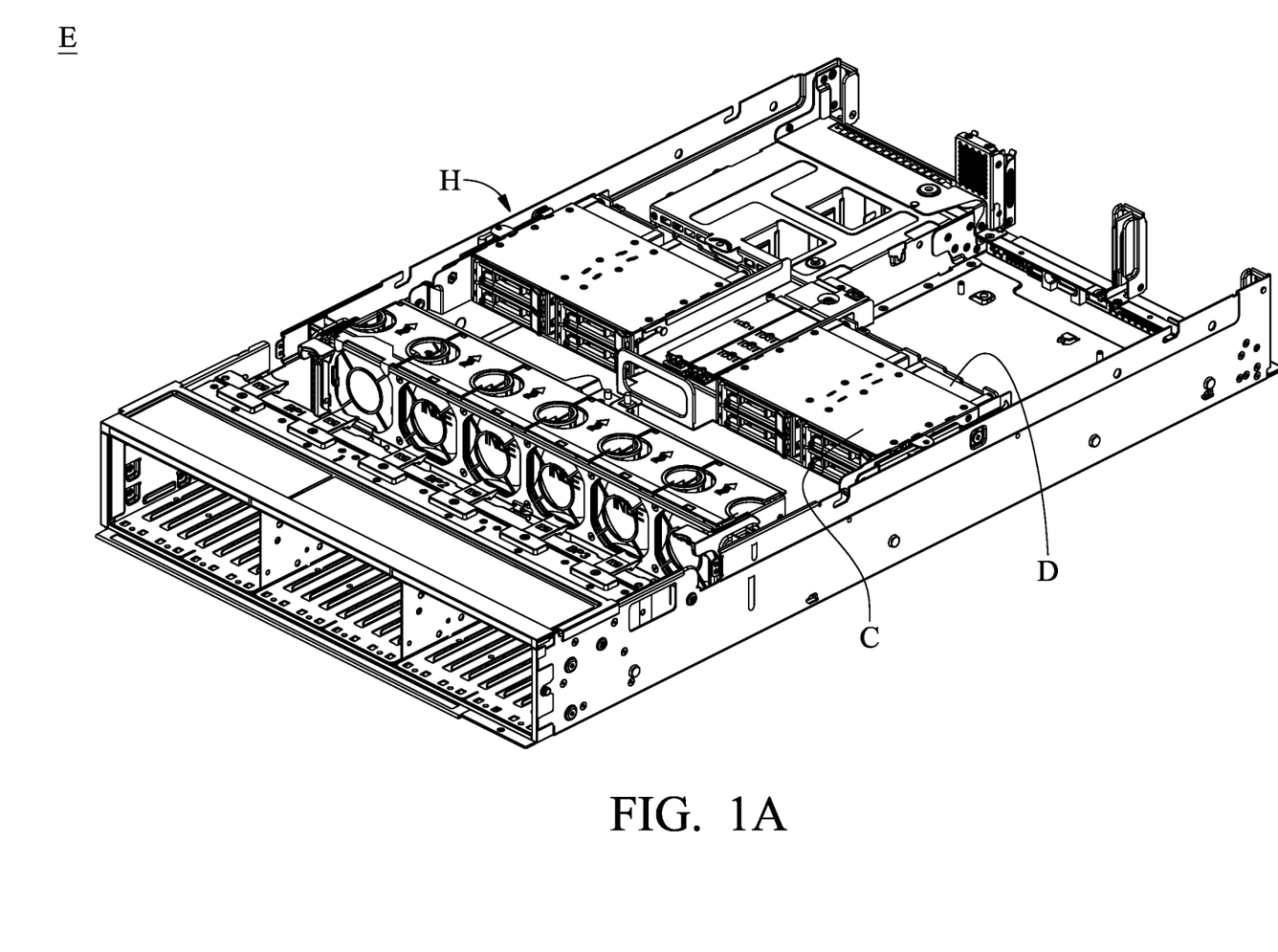
FIG. 1A is an assembled view of an electronic device of the embodiment of the invention, wherein a tray is in a first tray orientation relative to a housing.
Figure 1B:
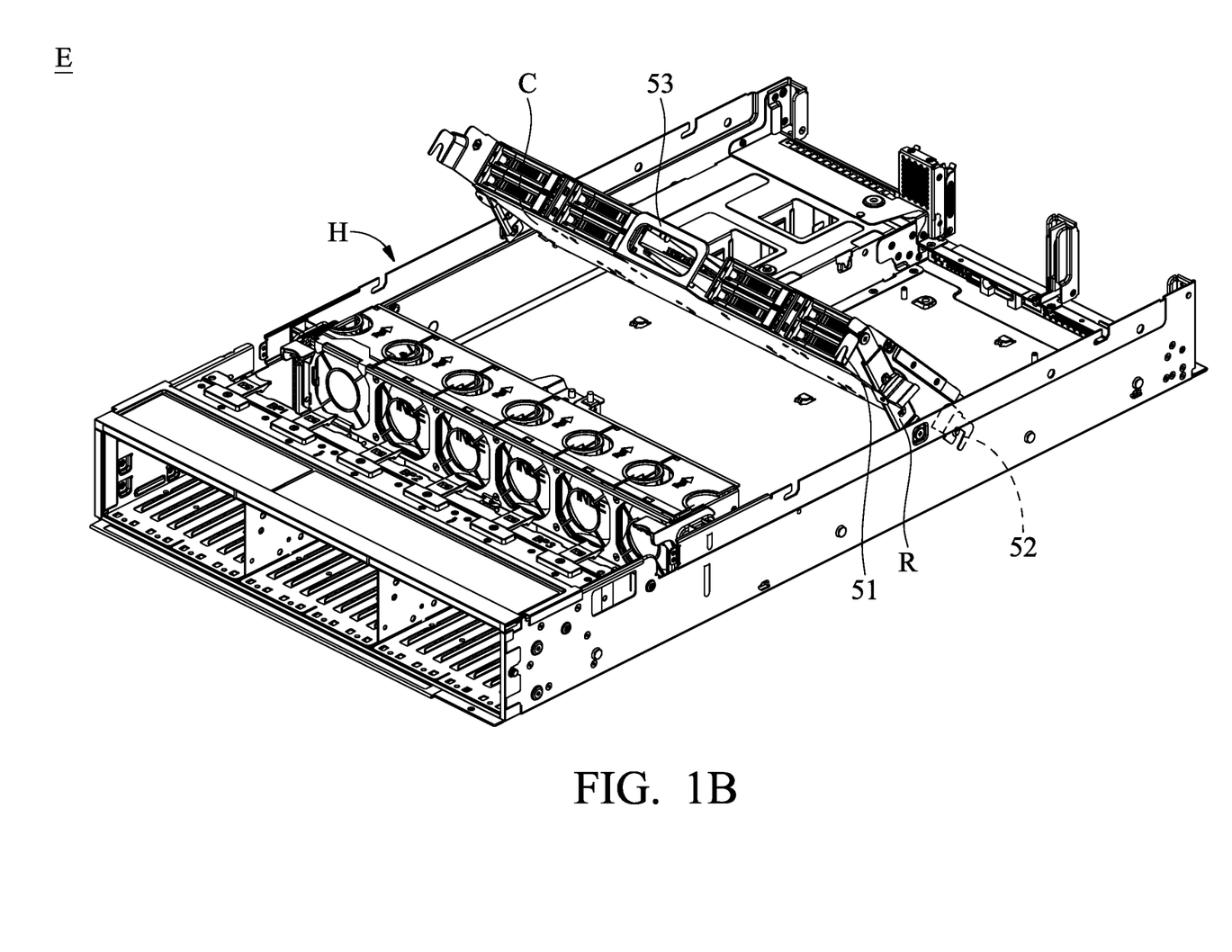
FIG. 1B is an assembled view of the electronic device of the embodiment of the invention, wherein the tray is in a second tray orientation relative to the housing.
Figure 1C:
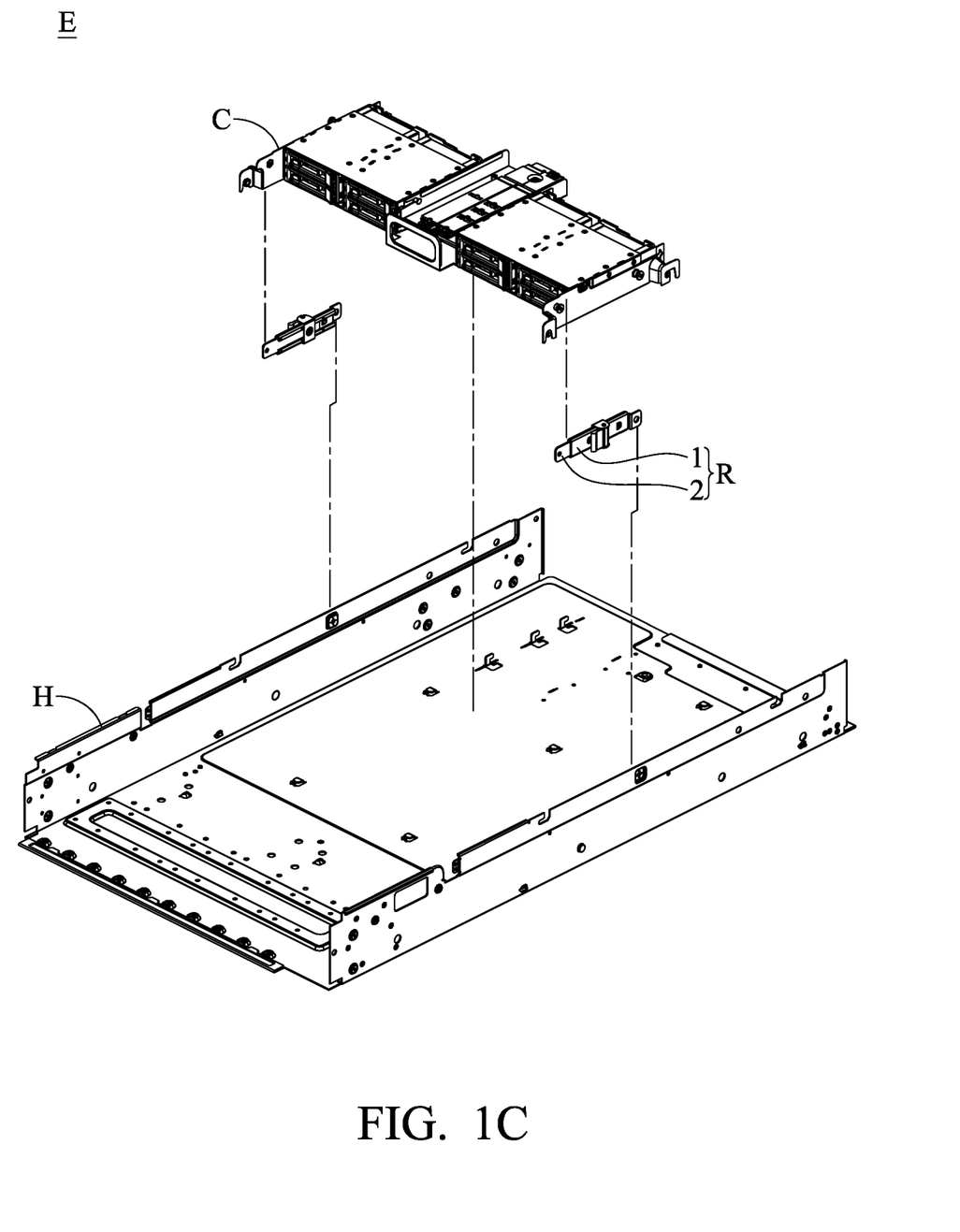
FIG. 1C is an exploded view of the electronic device of the embodiment of the invention.

FIGS. 1A and 1B are assembled view of the electronic device of the embodiment of the invention. FIG. 1C is an exploded view of the electronic device of the embodiment of the invention. With reference to FIGS. 1A, 1B and 1C, the electronic device E includes a housing H, a tray C and an orientation restriction mechanism R. The tray C is rotatably connected to the housing H. The tray C is adapted to be rotated between a first tray orientation (FIG. 1A) and a second tray orientation (FIG. 1B) relative to the housing H. One end of the orientation restriction mechanism R is adjustably connected to the housing H, and the other end of the orientation restriction mechanism R is adjustably connected to the tray C. When the tray C is in the first tray orientation (FIG. 1A), the orientation restriction mechanism R has a first mechanism length. When the tray C is in the second tray orientation (FIG. 1B), the orientation restriction mechanism R has a second mechanism length.

Figure 2A:
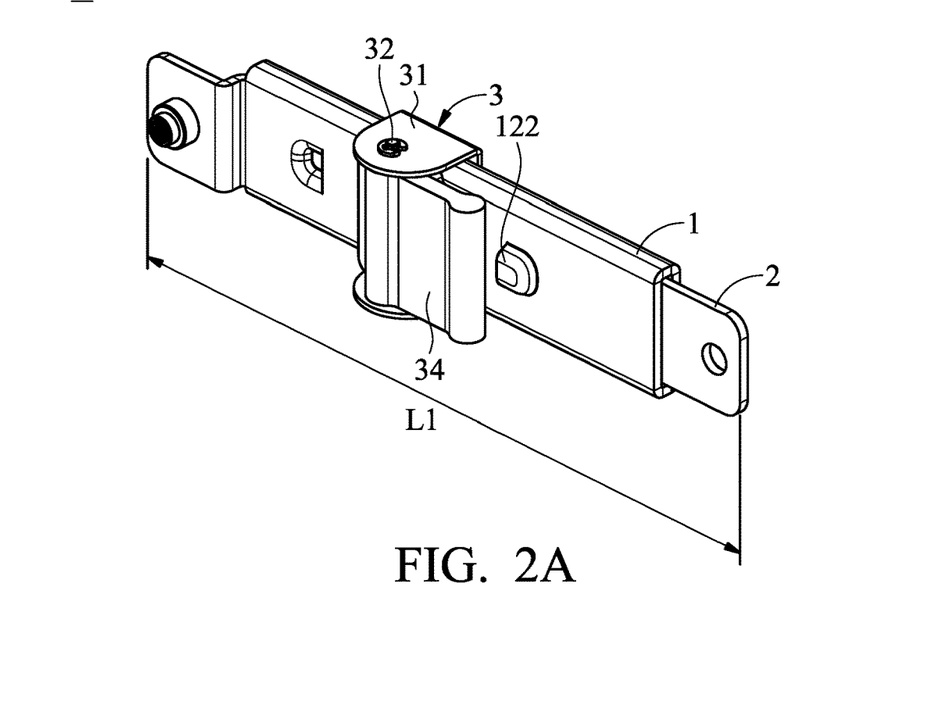
FIG. 2A is a perspective view of an orientation restriction mechanism of the embodiment of the invention, wherein the orientation restriction mechanism has a first mechanism length.
Figure 2B:
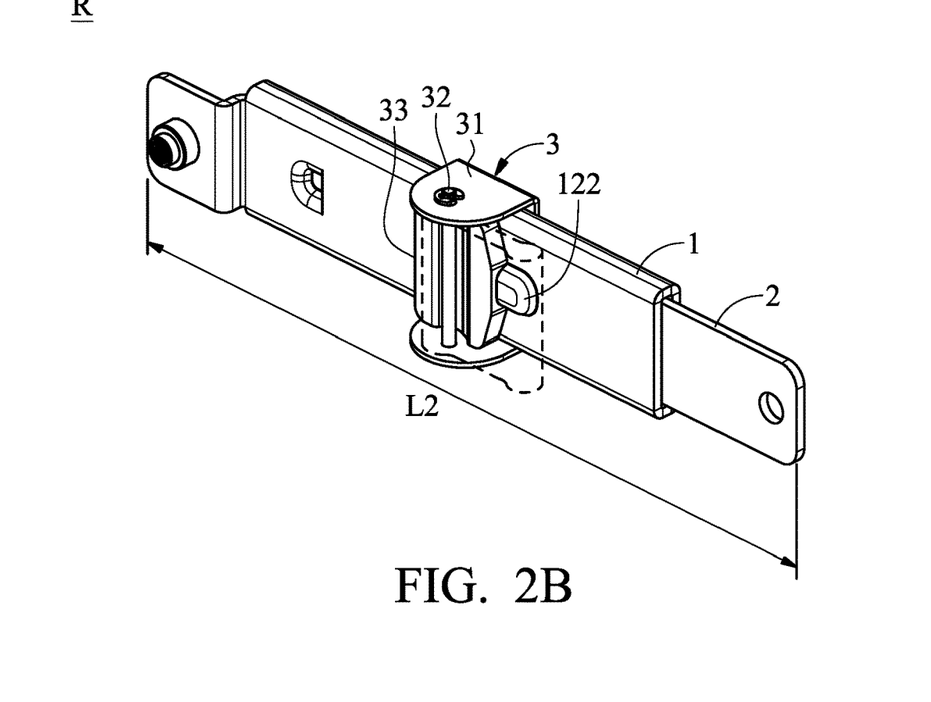
FIG. 2B is a perspective view of the orientation restriction mechanism of the embodiment of the invention, wherein the orientation restriction mechanism has a second mechanism length.
Figure 2C:
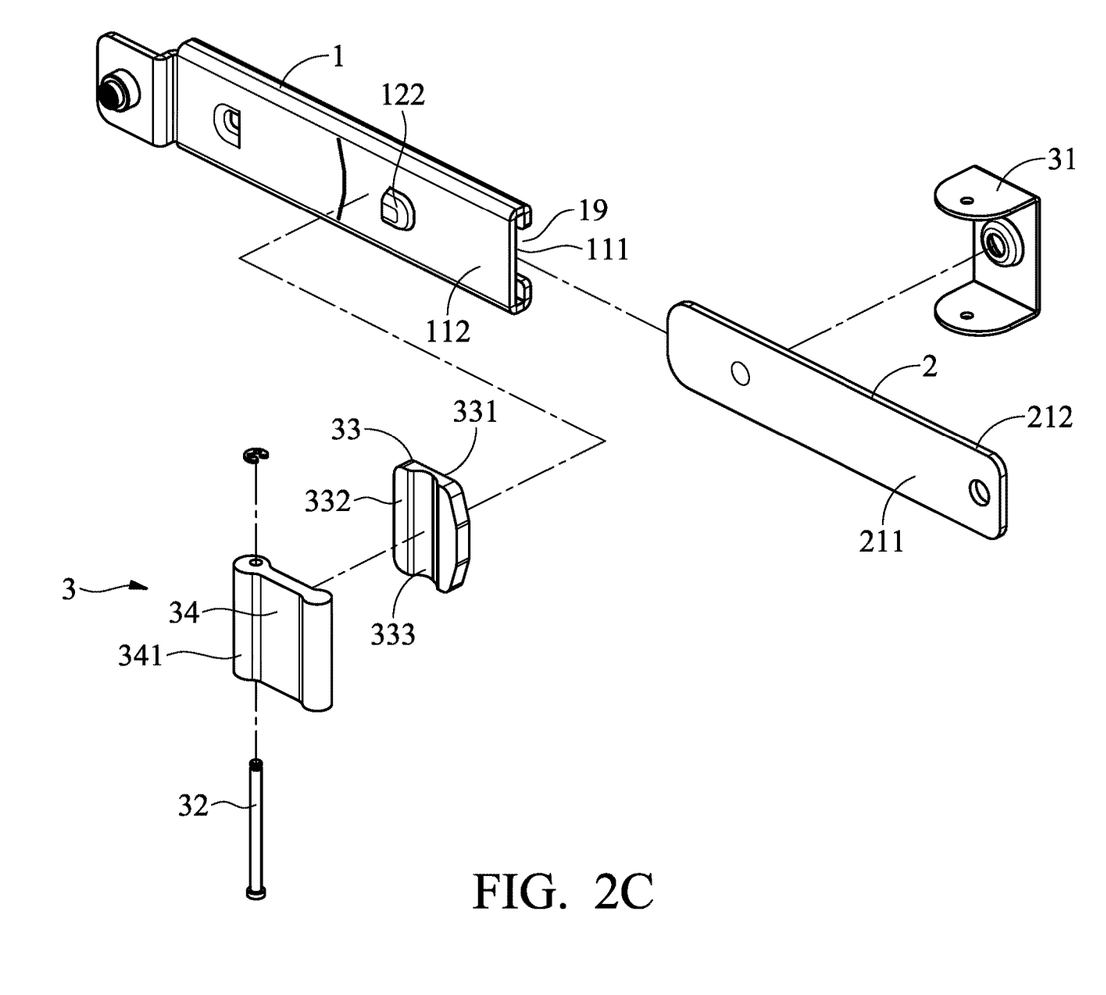
FIG. 2C is an exploded view of the orientation restriction mechanism of the embodiment of the invention.

FIGS. 2A and 2B are perspective views of the orientation restriction mechanism of the embodiment of the invention. FIG. 2C is an exploded view of the orientation restriction mechanism of the embodiment of the invention. With reference to FIGS. 2A, 2B and 2C, in one embodiment, the orientation restriction mechanism R includes a first rod 1 and a second rod 2. The second rod 2 is connected to the first rod 1. The second rod 2 is adapted to slide relative to the first rod 1. When the second rod 2 is in a first rod position relative to the first rod1 (FIG. 2A), the orientation restriction mechanism R has the first mechanism length L1. When the second rod 2 is in a second rod position relative to the first rod 1 (FIG. 2B), the orientation restriction mechanism R has the second mechanism length L2.

With reference to FIGS. 2A, 2B and 2C, in one embodiment, the orientation restriction mechanism R further includes a locking unit 3. The locking unit 3 is adapted to restrict the position of the second rod 2 relative to the first rod 1 to lock the length of the orientation restriction mechanism R. The locking unit 3 is connected to the first rod 1 and the second rod 2.

With reference to FIGS. 2A, 2B and 2C, in one embodiment, the first rod 1 includes a rod slot 19, and the second rod 2 is adapted to slide in the rod slot 19.

Figure 3:
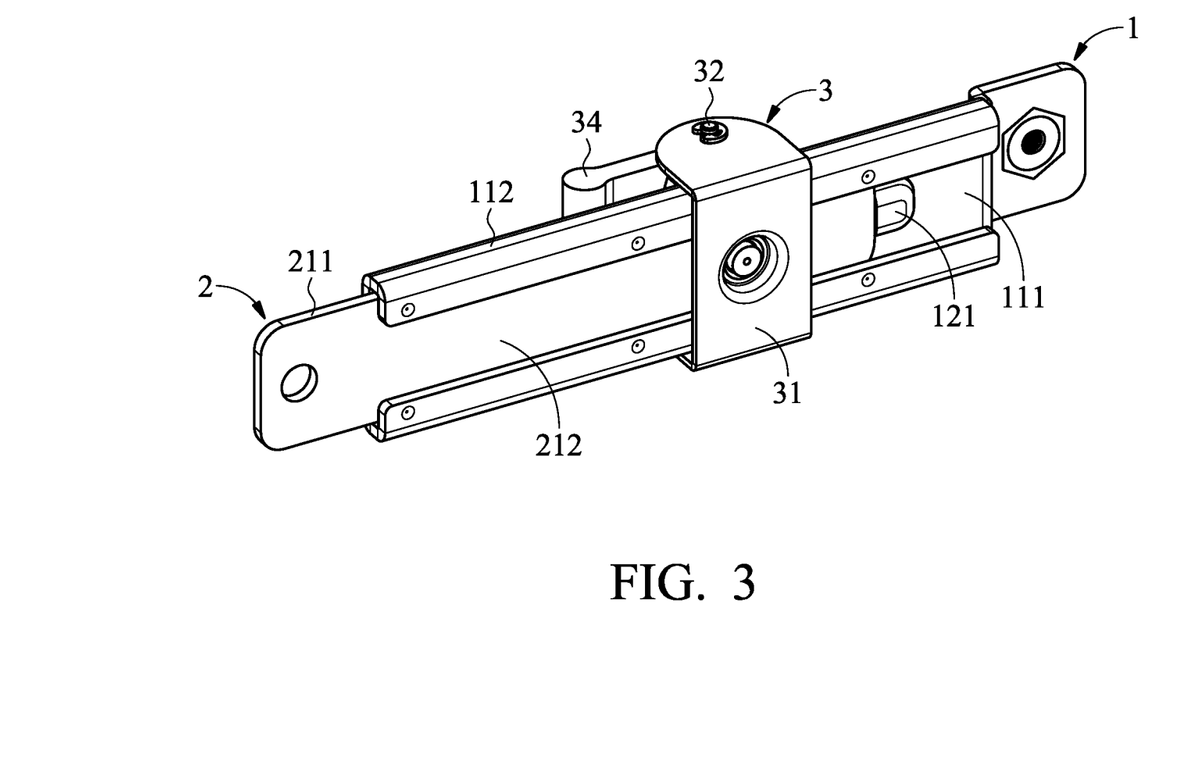
FIG. 3 shows a fixing base affixed to a second rod of the embodiment of the invention.

FIG. 3 shows the fixing base affixed to the second rod of the embodiment of the invention. With reference to FIGS. 2A, 2B, 2C and 3, in one embodiment, the locking unit 3 includes a fixing base 31, a shaft 32, a fitting member 33 and a lever 34. The fixing base 31 is affixed to the second rod 2 (with reference to FIG. 3, in this embodiment, the fixing base 31 is riveted to the second rod 2). The fitting member 33 abuts the first rod 1. The lever 34 pivots on the fixing base 31 via the shaft 32.

With reference to FIGS. 2A, 2B, 2C and 3, in one embodiment, the first rod 1 includes a first rod inner surface 111 and a first rod outer surface 112. The first rod inner surface 111 faces the second rod 2. The first rod outer surface 112 is opposite the first rod inner surface 111 (the first rod outer surface 112 and the first rod inner surface 111 are on two opposite sides of the first rod). The fitting member 33 abuts the first rod outer surface 112. The second rod 2 includes a second rod inner surface 211 and a second rod outer surface 212. The second rod inner surface 211 faces the first rod 1. The fixing base 31 is affixed to the second rod outer surface 212.

With reference to FIGS. 2A, 2B, 2C and 3, in one embodiment, the fitting member 33 includes a first fitting surface 331 and a second fitting surface 332. The first fitting surface 331 is opposite the second fitting surface 332 (the first fitting surface 331 and the second fitting surface 332 are one opposite sides of the fitting member 33). The first fitting surface 331 contacts the first rod outer surface 112, the lever 34 is adapted to contact the second fitting surface 332.

Figure 4A:
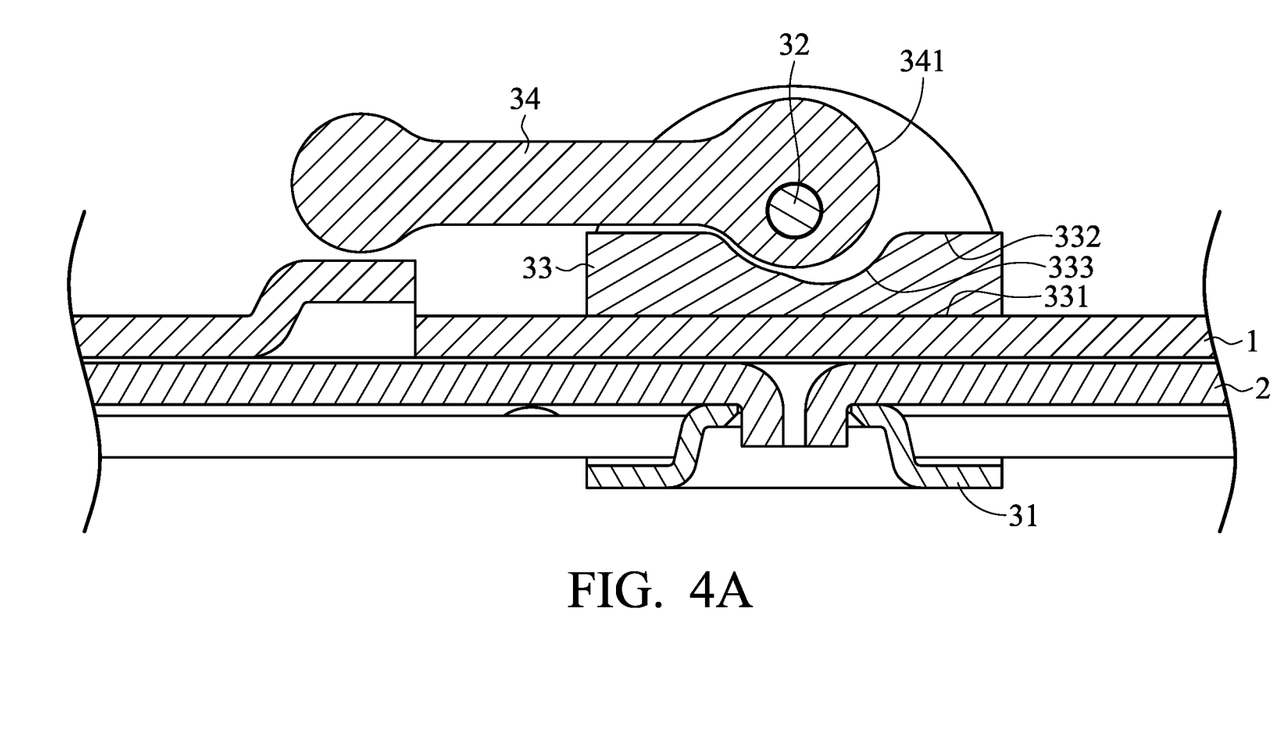
FIG. 4A shows a lever of the embodiment of the invention in a first lever orientation.
Figure 4B:
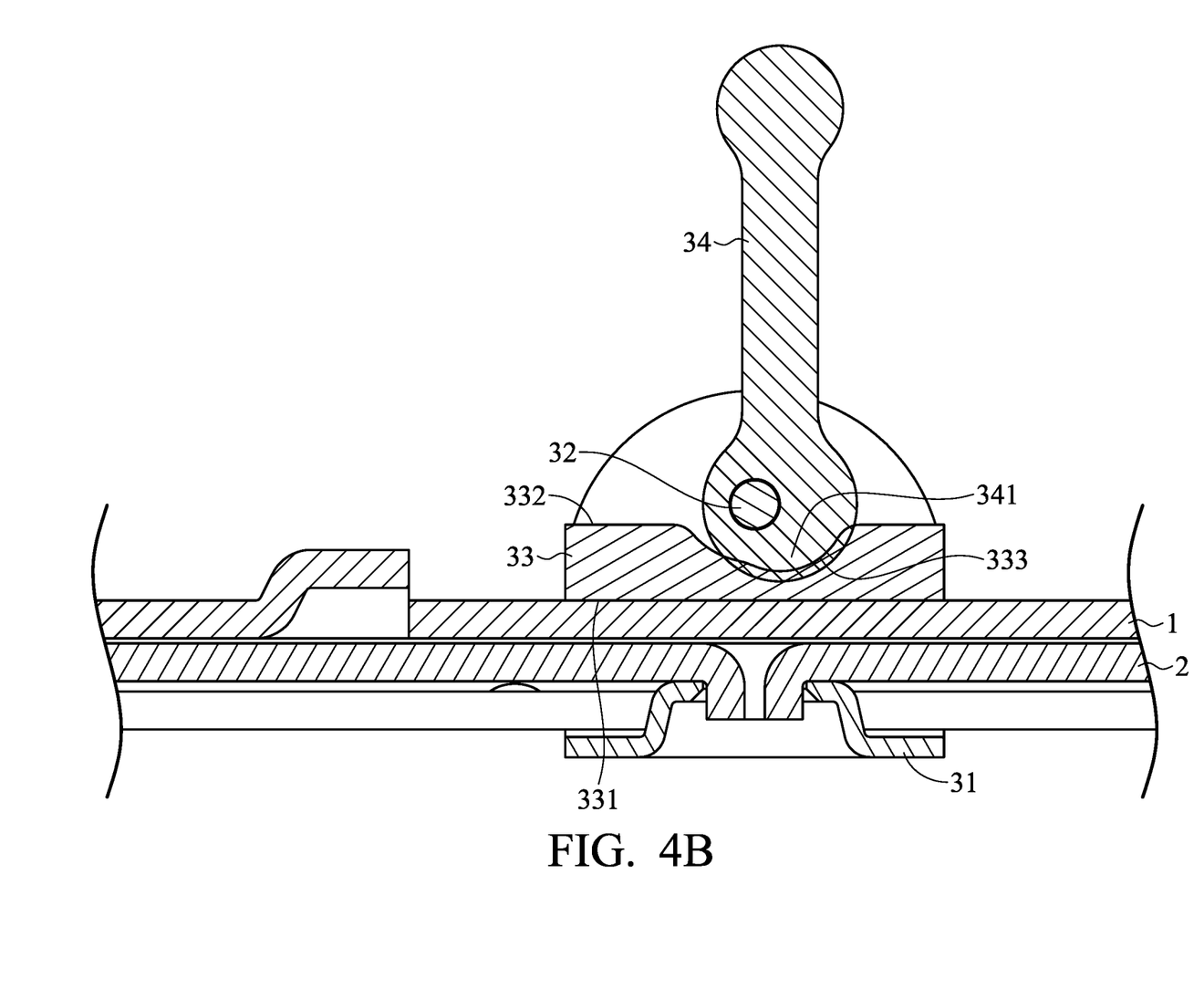
FIG. 4B shows the lever of the embodiment of the invention in a second lever orientation.

FIG. 4A shows the lever of the embodiment of the invention in the first lever orientation. FIG. 4B shows the lever of the embodiment of the invention in the second lever orientation. With reference to FIGS. 4A and 4B, the lever 34 is adapted to be rotated between a first lever orientation (FIG. 4A) and a second lever orientation (FIG. 4B). When the lever 34 is in the first lever orientation (FIG. 4A), the second rod 2 is adapted to slide relative to the first rod 1. When the lever 34 is in the second lever orientation (FIG. 4B), the position of the second rod 2 relative to the first rod 1 is fixed. Particularly, when the lever 34 is in the second lever orientation (FIG. 4B), the lever 34 presses the second fitting surface 332, the fitting member 33 pushes the first rod 1 and the second rod 2 toward the fixing base 31 to fix the position of the second rod 2 relative to the first rod 1.

With reference to FIGS. 2C, 4A and 4B, in one embodiment, the fitting member 33 includes a curved slot 333. The curved slot 333 is formed on the second fitting surface 332.

The lever 34 includes a cam portion 341. The cam portion 341 is adapted to roll along the curved slot 333. When the lever 34 is in the second lever orientation (FIG. 4B), the cam portion 341 presses the curved slot 333, the fitting member 33 pushes the first rod 1 and the second rod 2 toward the fixing base 31 to fix the position of the second rod 2 relative to the first rod 1 (In FIG. 4B, a portion of the fitting member 33 overlaps the cam portion 341 to show the deformation due to interference).

With reference to FIG. 3, in one embodiment, the first rod 1 includes a first stopper 121. The first stopper 121 is formed on the first rod inner surface 111. When the second rod 2 is in the first rod position relative to the first rod 1, the second rod 2 abuts the first stopper 121 to prevent the second rod from becoming separated from the first rod 1.

With reference to FIG. 2B, in one embodiment, the first rod 1 includes a second stopper 122. The second stopper 122 is formed on the first rod outer surface 112. When the second rod 2 is in the second rod position relative to the first rod 1, the fitting member 33 abuts the second stopper 122 to prevent the second rod from becoming separated from the first rod 1.

With reference to FIGS. 1A, 1B and 1C in one embodiment, the first rod 1 pivots on the housing H, and the second rod 2 pivots on the tray C.

Figure 5:
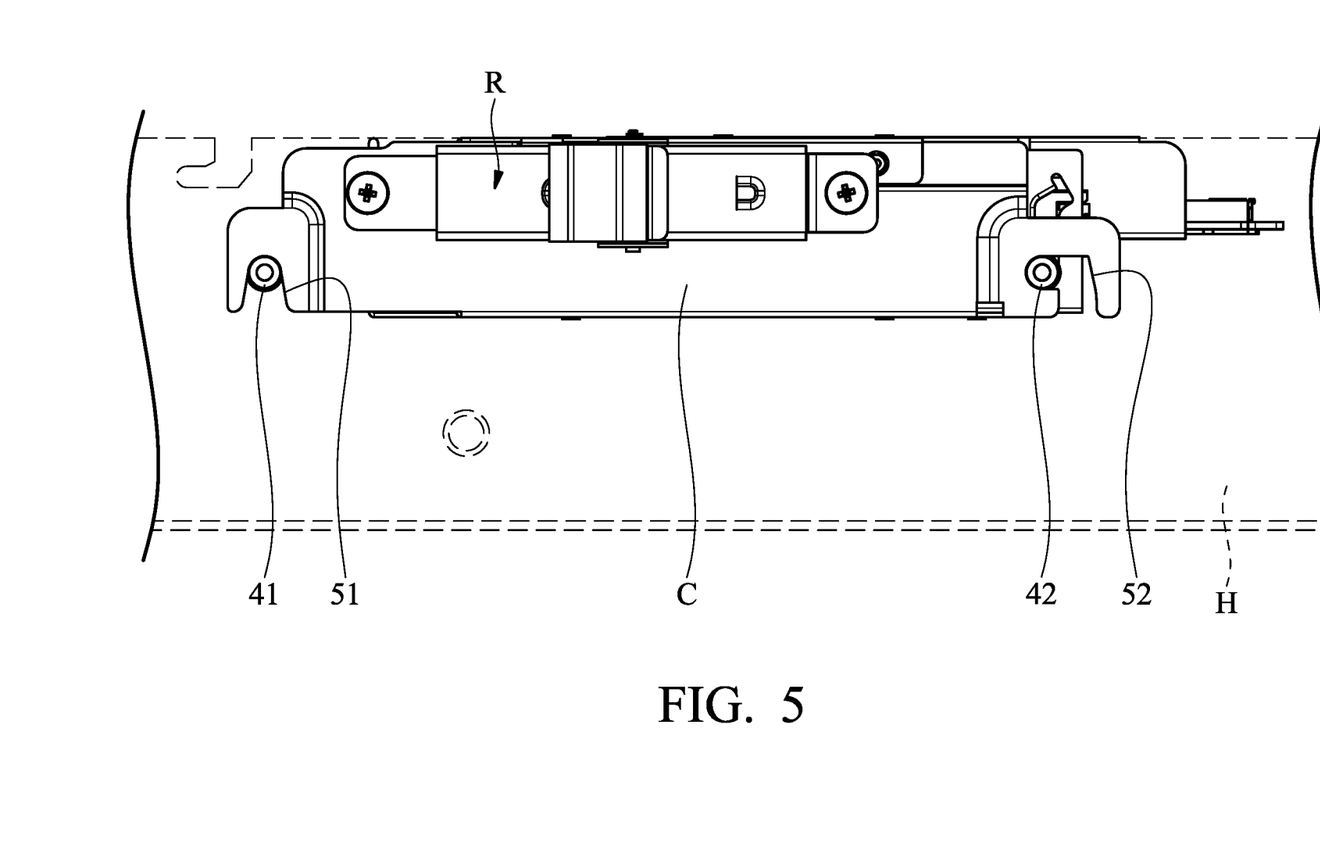
FIG. 5 shows a housing connected to the tray of the embodiment of the invention.

FIG. 5 shows the housing connected to the tray of the embodiment of the invention. With reference to FIG. 5, in one embodiment, the housing H includes a first housing post 41 and a second housing post 42. The tray C includes a first tray notch 51 and a second tray notch 52. The first tray notch 51 is connected to the first housing post 41. The second tray notch 52 is connected to the second housing post 42. In one embodiment, the first tray notch 51 is V-shaped, and the second tray notch 52 is L-shaped. The first tray notch 51 is V-shaped, and the first housing post 41 can be easily slid into the first tray notch 51. The second tray notch 52 is L-shaped, and the tray C can be rotated relative to the housing H around the second housing post 42.

With reference to FIGS. 1A, 1B and 5m in one embodiment, the tray R is rotated between the first tray orientation and the second tray orientation around the second housing post 42. The tray R includes a tray handle 53. The tray handle 53 is located on the front side of the tray C, and the first tray notches 51 and the second tray notches 52 are located on the right and left sides of the tray C.

With reference to FIG. 1A, in one embodiment, the electronic device E further includes a plurality of hard disks D, and the hard disks D are disposed on the tray C.

Utilizing the electronic device of the embodiment of the invention, when the user desires to detach the hard disk, the user can rotate the tray into the second tray orientation, and locks the tray in the second tray orientation using the orientation restriction mechanism. Therefore, the user can load the hard disk easily and conveniently.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising: a housing; a tray, rotatably connected to the housing; an orientation restriction mechanism, wherein one end of the orientation restriction mechanism is connected to the housing, the other end of the orientation restriction mechanism is connected to the tray, and the length between the two ends of the orientation restriction mechanism is adjustable, wherein the orientation restriction mechanism comprises a first rod and a second rod, the second rod is connected to the first rod, the second rod is adapted to slide relative to the first rod, wherein the orientation restriction mechanism further comprises a locking unit, the locking unit comprises a fixing base, a shaft, a fixing member and a lever, the fixing base is affixed to the second rod, the fitting member abuts the first rod, the lever pivots on the fixing base via the shaft; and the first rod comprises a first rod inner surface and a first rod outer surface, the first rod inner surface faces the second rod, the first rod outer surface is opposite the first rod inner surface, the fitting member abuts the first rod outer surface, the second rod comprises a second rod inner surface and a second rod outer surface, the second rod inner surface faces the first rod, and the fixing base is affixed to the second rod outer surface.

2. The electronic device as claimed in claim 1, wherein the tray is adapted to be rotated between a first tray orientation and a second tray orientation relative to the housing, and when the tray is in the first tray orientation, the orientation restriction mechanism has a first mechanism length, and when the tray is in the second tray orientation, the orientation restriction mechanism has a second mechanism length.

3. The electronic device as claimed in claim 2, wherein when the second rod is in a first rod position relative to the first rod, the orientation restriction mechanism has the first mechanism length, and when the second rod is in a second rod position relative to the first rod, the orientation restriction mechanism has the second mechanism length.

4. The electronic device as claimed in claim 3, wherein the locking unit is adapted to restrict the position of the second rod relative to the first rod to lock the length of the orientation restriction mechanism, and the locking unit is connected to the first rod and the second rod.

5. The electronic device as claimed in claim 4, wherein the first rod comprises a rod slot, and the second rod is adapted to slide in the rod slot.

6. The electronic device as claimed in claim 4, wherein the lever is adapted to be rotated between a first lever orientation and a second lever orientation, and when the lever is in the first lever orientation, the second rod is adapted to slide relative to the first rod, and when the lever is in the second lever orientation, the position of the second rod relative to the first rod is fixed.

7. The electronic device as claimed in claim 1, wherein the fitting member comprises a first fitting surface and a second fitting surface, the first fitting surface is opposite to the second fitting surface, the first fitting surface contacts the first rod outer surface, the lever is adapted to contact the second fitting surface, and when the lever is in the second lever orientation, the lever presses the second fitting surface, and the fitting member pushes the first rod and the second rod toward the fixing base to fix the position of the second rod relative to the first rod.

8. The electronic device as claimed in claim 7, wherein the fitting member comprises a curved slot, the curved slot is formed on the second fitting surface, the lever comprises a cam portion, the cam portion is adapted to roll along the curved slot, and when the lever is in the second lever orientation, the cam portion presses the curved slot, and the fitting member pushes the first rod and the second rod toward the fixing base to fix the position of the second rod relative to the first rod.

9. The electronic device as claimed in claim 1, wherein the first rod comprises a first stopper, the first stopper is formed on the first rod inner surface, and when the second rod is in the first rod position relative to the first rod, the second rod abuts the first stopper.

10. The electronic device as claimed in claim 9, wherein the first rod comprises a second stopper, the second stopper is formed on the first rod outer surface, and when the second rod is in the second rod position relative to the first rod, the fitting member abuts the second stopper.

11. The electronic device as claimed in claim 6, wherein the first rod pivots on the housing, and the second rod pivots on the tray.

12. The electronic device as claimed in claim 11, wherein the housing comprises a first housing post and a second housing post, the tray comprises a first tray notch and a second tray notch, the first tray notch is connected to the first housing post, and the second tray notch is connected to the second housing post.

13. The electronic device as claimed in claim 12, wherein the first tray notch is V-shaped, and the second tray notch is L-shaped.

14. The electronic device as claimed in claim 13, wherein the tray is rotated between the first tray orientation and the second tray orientation around the second housing post, the tray comprises a tray handle, the tray handle is located on a front side of the tray, and the first tray notches and the second tray notches are located on right and left sides of the tray.

15. The electronic device as claimed in claim 1, further comprising a plurality of hard disks, and the hard disks are disposed on the tray.

\* \* \* \* \*